United States Patent [19]

Katsuda et al.

[11] Patent Number: 5,993,699
[45] Date of Patent: Nov. 30, 1999

[54] ALUMINUM NITRIDE BASED COMPOSITE BODY ELECTRONIC FUNCTIONAL MATERIAL, ELECTROSTATIC CHUCK AND METHOD OF PRODUCING ALUMINUM NITRIDE BASED COMPOSITE BODY

[75] Inventors: Yuji Katsuda, Tsushima; Kiyoshi Araki, Nagoya; Tsuneaki Ohashi, Ogaki, all of Japan

[73] Assignee: NGK Insulators, Ltd., Japan

[21] Appl. No.: 09/084,357

[22] Filed: May 27, 1998

[30] Foreign Application Priority Data

Jun. 6, 1997 [JP] Japan .................................. 9-163511

[51] Int. Cl.$^6$ ............................... H01B 1/06; H01B 1/08
[52] U.S. Cl. ..................................... 252/521.5; 252/518.1; 252/521.1; 501/96.1; 501/98.4
[58] Field of Search ............................... 252/521.5, 300, 252/518.1, 521.1; 501/96–98

[56] References Cited

U.S. PATENT DOCUMENTS 5,001,089  3/1991  Kasori et al. ............................... 501/96
5,314,850  5/1994  Miyahara et al. ........................... 501/96

FOREIGN PATENT DOCUMENTS 7-226431  8/1995  Japan .
8-51001   2/1996  Japan .
8-102485  4/1996  Japan .

*Primary Examiner*—Mark Kopec
*Assistant Examiner*—Derrick Hamlin
*Attorney, Agent, or Firm*—Parkhurst & Wendel, L.L.P.

[57] ABSTRACT

This invention provides an aluminum nitride based composite body comprising aluminum nitride crystal grains and γ-alumina type crystals in which the aluminum nitride crystal grains has a specified oxygen content as measured by means of an X-ray microanalyzer and a specified spin amount per unit mg of aluminum obtained from a spectrum measured by an electron spin resonance method as well as a method of producing the same.

12 Claims, 6 Drawing Sheets

FIG_1

FIG_4

ALUMINUM NITRIDE BASED COMPOSITE BODY ELECTRONIC FUNCTIONAL MATERIAL, ELECTROSTATIC CHUCK AND METHOD OF PRODUCING ALUMINUM NITRIDE BASED COMPOSITE BODY

BACKGROUND OF THE INVENTION

1. Field of the Invention

This invention relates to an aluminum nitride based composite body mainly composed of aluminum nitride crystal grains, an electronic functional material and electrostatic chuck employing the same, and a method of producing an aluminum nitride based composite body.

2. Description of Related Art

At present, an electrostatic chuck is used for attracting and holding a semiconductor wafer in film forming processes for the semiconductor wafer such as transportation, light exposure, chemical vapor deposition (CVD), sputtering and the like, or steps of micro-machining, cleaning, etching, dicing and the like. As a substrate for the electrostatic chuck, dense ceramics have been watched. Particularly, a halogenous corrosive gas such as $ClF_3$ or the like is frequently used as an etching gas or a cleaning gas in an apparatus for the manufacture of the semiconductor. A dense aluminum nitride has a high corrosion resistance against the above halogenous corrosive gas. And also, the aluminum nitride is known to be a high thermal conductive material and to be high in the thermal shock resistance. Therefore, it is considered that it is preferable to make the substrate of the electrostatic chuck for a semiconductor manufacturing apparatus from an aluminum nitride sintered body.

In general, when the aluminum nitride is used as a substrate material for the electrostatic chuck, it is preferable that a volume resistivity is within a range of $10^8$–$10^{13}$ $\Omega\cdot cm$ at operating temperatures. However, the volume resistivity of aluminum nitride extremely decreases, for example, from $10^{16}$ $\Omega\cdot cm$ to $10^7$ $\Omega\cdot cm$ over a range of from room temperature to 600° C., so that it is impossible to stably develop the operation as an electric chuck in such a wide temperature range. Therefore, a service temperature of the electrostatic chuck is limited to a range of, for example, 200–400° C.

SUMMARY OF THE INVENTION

It is, therefore, an object of the invention to provide a novel material based on aluminum nitride being less in the change of volume resistivity over a wide temperature range as compared with the conventional one.

It is another object of the invention to provide a material based on aluminum nitride having a low temperature dependence of the volume resistivity as mentioned above and capable of being manufactured by a sintering method.

It is the other object of the invention to provide a material of a composition having a small content of metal impurities and not causing a contamination of the semiconductor.

According to a first aspect of the invention, there is the provision of an aluminum nitride based composite body comprising aluminum nitride crystal grains and γ-alumina type crystals, in which an oxygen content in the aluminum nitride crystal grains as measured by means of an X-ray microanalyzer is not less than 0.40% by weight but not more than 0.60% by weight, and a spin amount per unit mg of aluminum obtained from a spectrum as measured by an electron spin resonance method is not less than $1\times10^{12}$ spins/mg but not more than $1\times10^{13}$ spins/mg.

According to a second aspect of the invention, there is the provision of an aluminum nitride based composite body comprising aluminum nitride crystal grains and γ-alumina type crystals, in which a main peak of a spectrum obtained by a cathode luminescence is within a range of 350–370 nm, and a spin amount per unit mg of aluminum obtained from a spectrum as measured by an electron spin resonance method is not less than $1\times10^{12}$ spins/mg but not more than $1\times10^{13}$ spins/mg.

According to a third aspect of the invention, there is the provision of an electronic functional material comprising the aluminum nitride based composite body as previously mentioned above.

According to a fourth aspect of the invention, there is the provision of an electrostatic chuck provided with an attracting surface for attracting and holding a semiconductor wafer, which comprises a substrate made of the aforementioned aluminum nitride based composite body, a planar electrode embedded in the substrate, and a power source for supplying a direct current power to the planar electrode.

According to a fifth aspect of the invention, there is the provision of a method of producing an aluminum nitride based composite body comprising aluminum nitride crystal grains and γ-alumina type crystals, which comprises hot-pressing an aluminum nitride raw material so that a difference between a total oxygen content in the aluminum nitride based composite body and a conversion oxygen content of a rare earth element converted to an oxide thereof is 1.0–10% by weight.

BRIEF DESCRIPTION OF THE DRAWINGS

The invention will be described with reference to the accompanying drawings, wherein.

DESCRIPTION OF THE PREFERRED EMBODIMENTS

Figure 1:
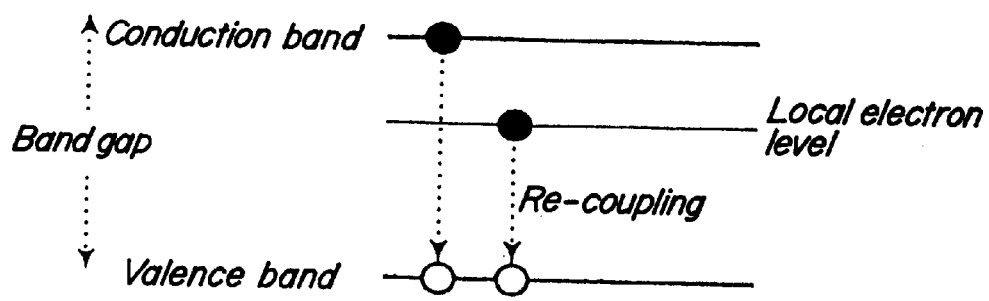
FIG. 1 is a schematic view illustrating a principle of a cathode luminescence.

The inventors have found that among sintered bodies having a large oxygen content of a specified aluminum nitride crystal grains as mentioned below, a novel aluminum nitride based composite body formed by further combining γ-alumina type crystals in the aluminum nitride crystal grains is low in the temperature dependence of volume resistivity over a wide temperature range and as a result the invention has been accomplished. Further, such an aluminum nitride based composite body can be produced by a hot-press sintering method. Moreover, even when metal impurities other than the rare earth element can be controlled to a very small quantity, the composite body can be produced by the hot pressing method, so that the contamination of the semiconductor can considerably be controlled.

Although the γ-alumina type crystals included in the composite body may contain a trace amount of nitrogen as a solid solution, a γ-alumina type crystal phase is maintained in the composite body.

In the aluminum nitride based composite body according to the invention, the aluminum nitride crystal is a main crystal phase and occupies not less than 10% by weight, and the γ-alumina type crystals are combined therein.

In the aluminum nitride based composite body according to the invention, it is necessary that an adequate amount of oxygen remains as a solid solution in the aluminum nitride crystal grains. That is, it is required that the oxygen content in the aluminum nitride crystal grains as measured by means of an X-ray microanalyzer is not less than 0.40% by weight and the spin amount per unit mg of aluminum obtained from the spectrum as measured by an electron spin resonance method is not less than $1 \times 10^{12}$ spins/mg but not more than $1 \times 10^{13}$ spins/mg. Alternatively, it is required that the main peak of a spectrum obtained by a cathode luminescence is within a range of 350–370 nm.

When an aluminum nitride raw material having a high purity is sintered by a hot pressing method, oxygen is retained as a solid solution in the aluminum nitride crystal grains by adjusting an amount of a rare earth element compound compounded to a small level and adding an adequate amount of alumina to the raw material. The oxygen in the crystal grains forms a donor level in a band gap as a result of replacement with nitrogen atom in AlN to bring about the improvement of the electron conductivity in the grains. Thus, the solid solution of oxygen in the aluminum nitride crystal grains is essential for decreasing the resistance in the inside of each crystal grain.

The present inventors have taken spectra by an electron spin resonance method (ESR method) with respect to samples of the aluminum nitride based composite body according to the invention in order to study the defect structures in the inside of the crystalline phase and at the grain boundary. The principle of ESR method will be explained briefly. Under a magnetic field, an energy level of unpaired electrons is split due to the Zeeman's effect. To this energy level sensitively react an interaction between an orbit movement of electron and a nuclear magnetic efficiency of an atom in the vicinity thereof. In the ESR method, it is possible to obtain information about atoms, chemical bond and the like in the vicinity of an atom having the unpaired electrons by measuring the split energy levels.

It is required that the spin amount per unit mg of aluminum obtained from the spectrum measured by the electron spin resonance method is not less than $1 \times 10^{12}$ spins/mg but not more than $1 \times 10^{13}$ spins/mg. This measuring method is according to a method described by Hiroaki Ohya and Jun Yamauchi: "Electron Spin Resonance" (published by Kodansha Co., Ltd.). The inventors quantitatively determine a single super fine line of $Mn^{2+}$/MgO by using a solution of TEMPOL (4-hydroxy-2,2,6,6-tetramethylpyperidine-1-oxyl) having a known spin amount and calculate a spin amount per unit mg of aluminum from an area ratio of peaks by comparing the spin amount through the quantified line.

Further, the inventors measure a cathode luminescence spectrum in order to further clarify the feature of the aluminum nitride based composite body according to the invention by estimation of an electron state in a band gap exerting on the electric properties of the composite body.

In general, the cathode luminescence is a radiation emitted from a sample when the sample is irradiated by an electron ray. As diagrammatically shown in FIG. 1, if an electron is excited from a valence band to a conduction band, a hole is formed in the valence band. Then, a radiation having a wavelength corresponding to a bad gap between the conduction band and the valence band is produced when the excited electron transits from the conduction band to the valence band and is recombined with the hole in the valence band. In addition, if a local electron level other than the conduction band is generated by actions of defects and impurities included in the crystal, a radiation is produced when an excited electron transits from the local electron level to the valence band and is recombined with the hole. Therefore, it is possible to obtain information about an energy band structure, a crystallizability and defects and impurities included in the crystal from the cathode luminescence spectrum.

Figure 2:
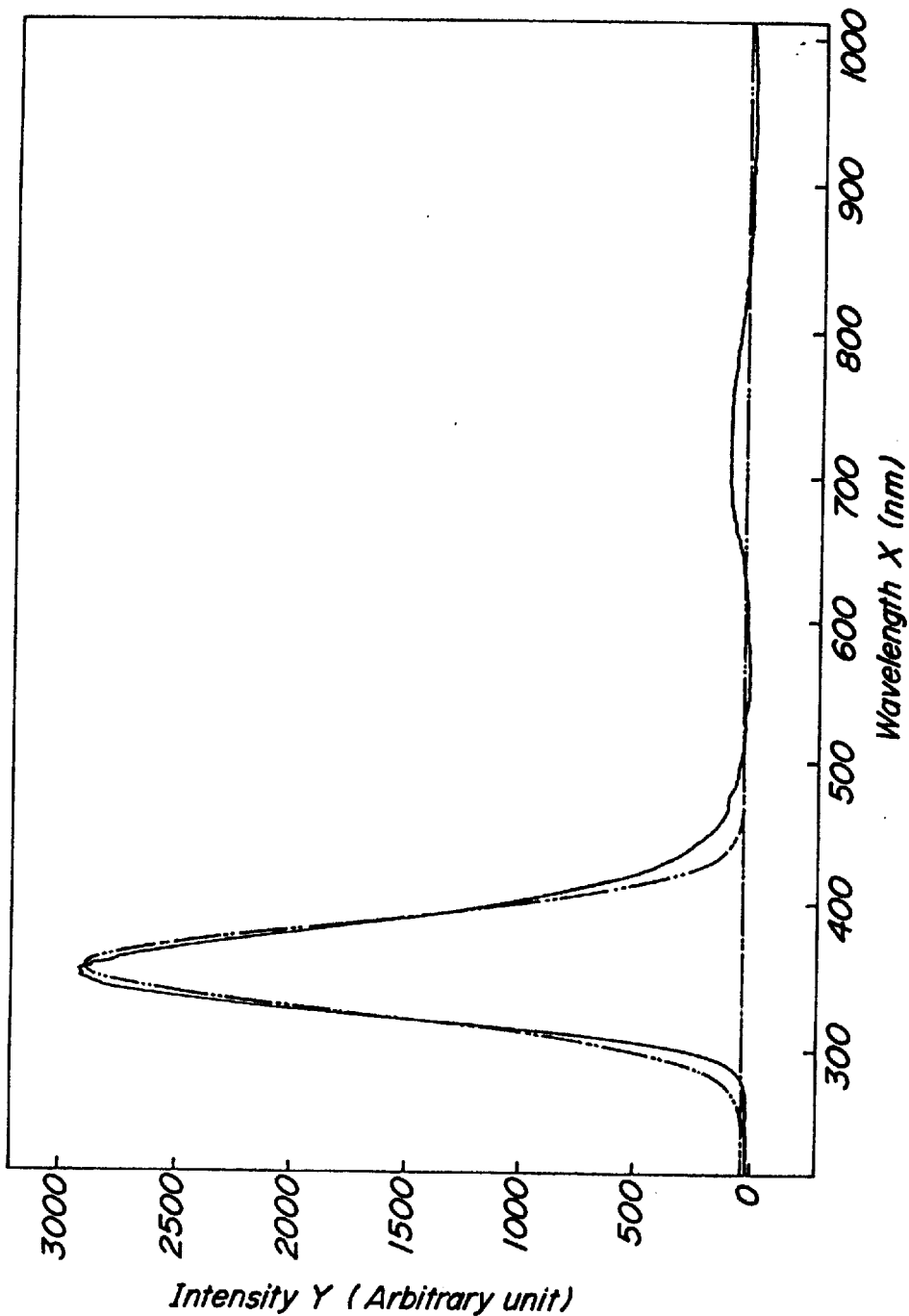
FIG. 2 is a graph showing a spectrum obtained by a cathode luminescence of the composite body in Example 1 according to the invention.

The composite body according to the invention has a strong main peak within a wavelength range of 350–370 nm as shown, for example, in FIG. 2 showing a cathode luminescence spectrum measured on the composite body. And also, a weak peak, which is assumed as a double multiple wave of the main peak, is detected within a wavelength range of 650–750 nm.

For the comparison, the inventors provide a high density sintered body prepared by adding aluminum nitride powder with 5% by weight of yttria powder and firing them and measure a cathode luminescence spectrum thereof. As a result, weak peaks are observed at wavelengths of about 340 nm, 500 nm and 600 nm, respectively.

Such a difference in the wavelength of the radiation indicates a difference in the kind of the radiation (electron levels in the band gap). And also, a difference in the radiation intensity indicates a difference in the density of electrons based on the impurities. In case of the composite body according to the invention, a very strong and sharp peak is observed within a wavelength range of 350–370 nm, which shows the existence of a very strong new electron level and means that the density of electrons based on a particular impurity is high.

When the oxygen content in the aluminum nitride crystal grains constituting the composite body according to the invention is measured by means of an X-ray microanalyzer based on the above measured results, it has been found that the oxygen content is required to be within a range of 0.4–0.6% by weight.

In the composite body according to the invention, it is considered that when oxygen forms a solid solution in the aluminum nitride crystal grains as a main crystal phase constituting the composite body, it intrudes into nitrogen lattice site to replace with nitrogen. In this case, a conduction electron (donor) or an empty lattice of aluminum is formed by charge compensation between nitrogen $N^{3-}$ and oxygen $O^{2-}$. Therefore, it is considered that a solid solution amount of oxygen in the aluminum nitride crystal grains largely contributes to an electrical conductivity in the aluminum nitride crystal grains.

Figure 4:
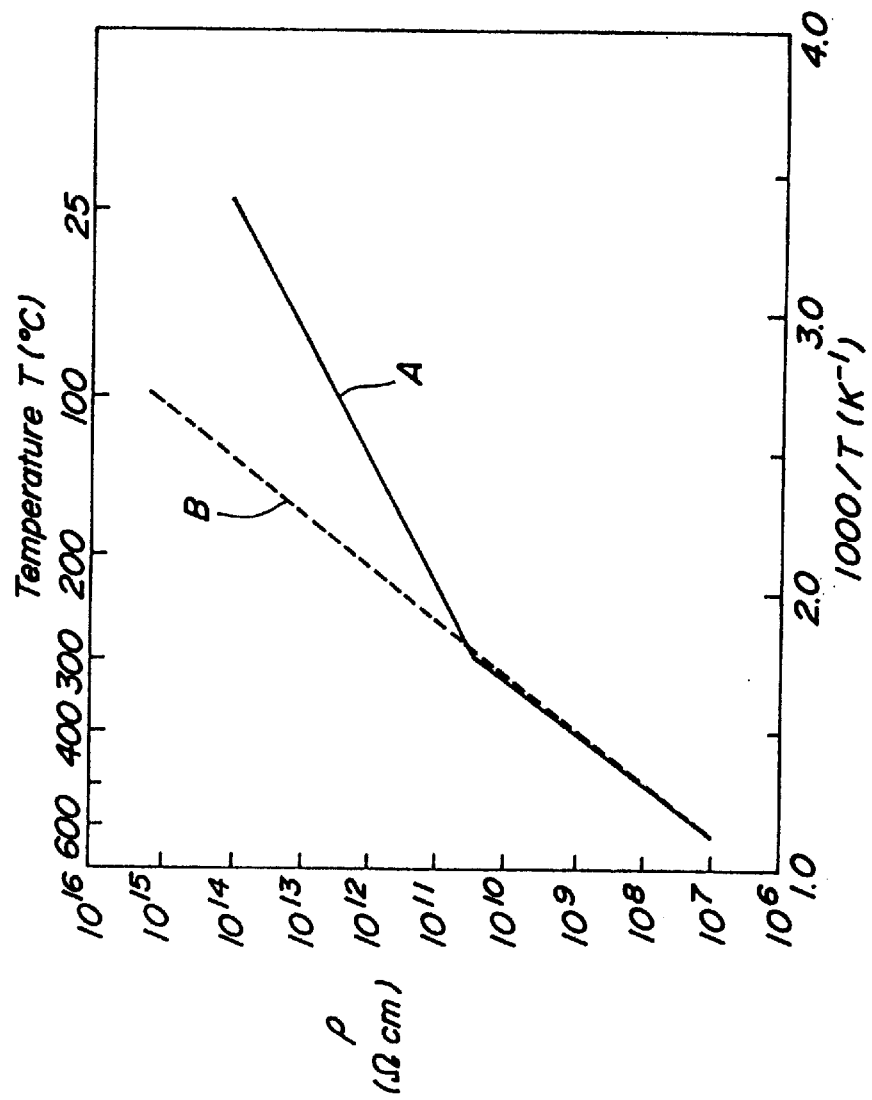
FIG. 4 is a graph showing a relation between volume resistivity and temperature T (or 1/T) with respect to the composite body according to the invention and the known aluminum nitride sintered body.

In this connection, it is found out that the composite body according to the invention has a relation between volume resistivity and temperature T (or 1/T) as shown, for instance, by a graph in FIG. 4. A line B shows the characteristic of aluminum nitride sintered body in which a fairly high linearity is observed between the volume resistivity and 1/T over a temperature range of 100–600° C. On the contrary, a line A shows the relation between the volume resistivity and 1/T in the composite body according to the invention, in which the change of the volume resistivity is surprisingly moderate over a temperature range between room temperature and 300° C., while the relation is substantially similar to that of the aluminum nitride sintered body over a temperature range between 300° C. and 600° C.

In the composite body according to the invention, γ-alumina type crystal is further existent as a crystal subphase. In the γ-alumina type crystal may be included a trace amount of nitrogen as a solid solution. The electrical conduction is considered to be caused through the aluminum nitride crystal and the γ-alumina type crystal. In the composite body shown in FIG. 4, therefore, it is considered that the lowering of activation energy in the temperature dependence of volume resistivity over a temperature range between room temperature and 300° C. is dominantly based on the volume resistivity of the γ-alumina type crystal. On the other hand, the volume resistivity of the aluminum nitride crystal grain is considered to be dominant in the electrical conduction over a temperature range of 300–600° C.

In the invention, the aluminum nitride raw material is sintered by hot pressing so that a difference between a total oxygen content in the aluminum nitride based composite body and a conversion oxygen content of a rare earth element converted to an oxide thereof is 1.0–10% by weight.

That is, it is preferable that the content of rare earth element in the composite body is not more than 0.5% by weight as converted to an oxide thereof. When it exceeds 0.5% by weight, oxygen existing in aluminum nitride crystal grain diffuses toward the outside of the grain in the sintering process. When oxygen is discharged to purify the inside of the grain as mentioned above, the thermal conductivity is improved by reduction of phonon scattering accompanied with the decrease of oxygen content, but the temperature dependence of volume resistivity becomes large.

From this point of view, it is more preferable that the content of the rare earth element in the composite body is not more than 0.4% by weight as converted to an oxide thereof.

On the other hand, in order to obtain a homogeneous sintered body, the content of the rare earth element in the composite body is particularly preferable to be not less than 0.05% by weight as converted to an oxide thereof.

If it is intended to use the composite body according to the invention in a production process of semiconductors, it is unfavorable to add an alkaline metal or a transition metal considered as an impurity in this process to the composite body.

In the invention, therefore, it is preferable to use the raw material having a high purity. Concretely, it is preferable to render a content of metal impurities other than the rare earth element into not more than 500 ppm. Further, it is more preferable to render the content of the metal impurities other than the rare earth element into not more than 100 ppm which includes 0 ppm or not more than the limit of detection.

And also, the average grain size of the aluminum nitride crystal grains in the composite body is preferable to be not more than 10 μm, more particularly not more than 5 μm, which tends to more lower the temperature dependence of volume resistivity.

The lower limit of the average grain size of the aluminum nitride crystal grain is not critical, but it is preferable that the average grain size is generally not less than 1.0 μm.

In the composite body according to the invention, it is favorable that a maximum value of a relative ratio of diffraction intensities ($I_{002}/\Sigma I$) on a pair of faces perpendicular to each other as measured by an X-ray diffraction method is not less than 1.3. Namely, when the composite body is fired by hot pressing and then the X-ray diffraction measuring is conducted from each direction of the composite body, the diffraction intensity of (002) face in each direction is defined as [$I_{002}$: peak intensity of (002) face]/[$\Sigma I$: sum of diffraction intensity in all directions]. In this case, an anisotropy is caused in a direction of crystal growth among the aluminum nitride crystal grains by hot pressing.

When the relative ratio of diffraction intensities ($I_{002}/\Sigma I$) on a pair of faces perpendicular to each other is measured with respect to all directions, it is preferable that the maximum value in the measured relative ratios is not less than 1.3. In general, a pair of faces indicating the maximum relative ratio are faces parallel to and perpendicular to the hot-pressing direction.

As an aluminum nitride raw material powder, use may be made of powder obtained by a direct nitriding method, and also powder formed by a reductive nitriding method may be used. At present, the powder formed by the reductive nitriding method is preferable because powder having less content of metal impurities is easy to be supplied. Even in the powder obtained by the direct nitriding method, however, there is caused no problem if a purity of aluminum as a starting material is increased and inclusion of impurities is prevented in each step of the manufacturing process.

In the finally obtained composite body, it is favorable that the difference between the total oxygen content in the aluminum nitride sintered body and the oxygen content in the oxide of the rare earth element is not less than 0.5% by weight, so that the oxygen content in the raw material powder becomes important. When the oxygen content in the raw material powder is low, it is required to conduct a post-treatment for introducing oxygen into the raw material powder. For example, the oxygen content in the raw material powder can be increased by an oxidation treatment in which the raw material powder is heated at a temperature of 400–800° C. in an oxidizing atmosphere such as air or the like. Alternatively, oxygen can be supplied to the raw material powder by adding alumina powder or an alumina precursor.

In this case, when oxygen included in the raw material is converted to alumina, the alumina content is preferable to be 1.0–10% by weight in the raw material.

Further, the rare earth element may be added to the raw material powder in various forms. For example, powder of the rare earth element itself or a compound thereof can be added to the aluminum nitride raw material powder.

In general, an oxide of rare earth element is most available. However, in case of using the oxide of the rare earth element, since the amount of the rare earth element added is slight in the invention, if the dispersion of the oxide of the rare earth element is insufficient, it is difficult to spread the rare earth element over the whole of the sintered body. As a result, the scattering of various properties such as volume resistivity and the like is caused in any portions of the sintered body.

In the invention, therefore, a compound of the rare earth element such as nitrate, sulfate, alkoxide or the like is dissolved in a proper solvent to obtain a solution containing such a compound, which is added to the aluminum nitride raw material powder. In this case, even if the amount of the rare earth element added is slight, the rare earth element is uniformly dispersed into any portions of the sintered body. And also, the rare earth element is probably dispersed onto the surface of each grain as a very thin layer, so that the compound of the rare earth element having a high resistivity hardly segregate. If the dispersion is insufficient, there may locally be precipitated the rare earth element containing crystal.

In case of using a dry press shaping process, a spray dry process can be proposed as a process for drying the raw material powder. This is particularly usable as an instant drying process for the compound of the rare earth element as a trace additive.

Alternatively, a tape shaping process may be used. In this case, the solution obtained by dissolving the compound of the rare earth element such as nitrate, sulfate and alkoxide or the like in the solvent may be added as an additive in a usual tape shaping step. Since the addition amount is slight, there is no influence upon the shapability and degreasability.

In the preparation step, the aluminum nitride raw material powder is dispersed into the solvent, to which may be added the compound of the rare earth element compounds in the form of oxide powder or solution as mentioned above. The mixing may be conducted by simple stirring, but when it is required to pulverize aggregates in the raw material powder, a mixing and pulverizing machine such as pot mill, trommel, attrition mill or the like may be used. In the case of using an additive soluble in the solvent for pulverization, the time of conducting the mixing and pulverizing step may be a shortest time required for the pulverization of the powder. Moreover, a binder such as polyvinyl alcohol or the like may be added.

A spray dry process is preferable for the step of drying the solvent for pulverization. And also, it is favorable to adjust a grain size of a dried powder through a sieve after the conduction of a vacuum drying process.

In the powder shaping step, a mold pressing process may be employed for the manufacture of a disc-type shaped body. In this case, a shaping pressure is preferable to be not less than 100 kgf/cm$^2$, but is not particularly limited if it is possible to maintain the shaping. Further, the shaping material may be filled in a hot press die in form of powder.

When a binder is added to the shaped body, the degreasing may be carried out at a temperature of 200–800° C. in an oxidizing atmosphere prior to the firing.

When an additive containing the rare earth element is added in form of nitrate, sulfate or carbonate, the powdery raw material or the shaped body of powder may be subjected to a denitrification, desulfurization or decarboxylation treatment prior to the firing. Such a degassing step may be conducted by heating the above powdery raw material or shaped body in the oxidizing atmosphere likewise the degreasing step. In this case, it is required to care about the damage of a furnace due to the resulting NOx gas, SOx gas or the like.

Moreover, the degassing may be conducted during the firing without conducting separately the degassing steps such as denitrification, desulfurization, decarboxylation and the like.

Then, the shaped body is fired by a hot pressing process. The pressure in the hot pressing is required to be not less than 50 kgf/cm$^2$, preferably not less than 200 kgf/cm$^2$. The upper limit of the pressure is not particularly restricted, but is practically not more than 1,000 kgf/cm$^2$ and more preferably not more than 400 kgf/cm$^2$ in order to prevent the damage of the furnace tool such as a mold or the like.

It is possible to raise the pressure up to a maximum pressure at once. However, it is particularly preferable to raise the pressure stepwise in accordance with the rise of the temperature in order to improve the dimensional accuracy of the sintered body.

When the disc-type shaped body is fired by a hot pressing process, it is preferable to accommodate the shaped body in a sleeve having an inner diameter slightly larger than an outer diameter of the shaped body.

When the degassing is required at a time of raising the temperature, it is preferable to promote exhalation of gas by heating under vacuum over a temperature range of from room temperature to 1,600° C.

Furthermore, it is preferable to raise the temperature at a temperature rising rate of not less than 50° C./hour but not more than 1,500° C./hour up to a maximum temperature in the firing. The maximum temperature is preferable to be 1,700–2,300° C. If the maximum temperature exceeds 2,300° C., aluminum nitride begins to decompose. If the maximum temperature is lower than 1,700° C., the effective grain growth is restrained.

Particularly, the temperature dependence of volume resistivity tends to more decrease when the maximum temperature in the firing is within a range of 1,700–1,900° C.

In the hot pressing process, there is now proposed a method of applying boron nitride as a parting agent between the shaped body or raw material powder and a carbon jig. In the invention, however, there is a fear of incorporating boron into the sintered body, so that the use of the parting agent is unfavorable.

A metal can be embedded in the composite body according to the invention, which is particularly suitable as an electrode embedded article used under an environment hating impurities. As such an application mention may be made of a ceramic electrostatic chuck, a ceramic heater, a high frequency electrode apparatus and the like. Particularly, it can be used in the electrostatic chuck.

When the composite body according to the invention is used as an electrostatic chuck for attracting a semiconductor wafer, the attracting property as the electrostatic chuck can considerably be improved over a temperature range of from about room temperature to 600° C., preferably about 100° C. to 500° C. And also, the response for detaching the wafer is good because electric charge is lost at a sufficient rate immediately after turning off the voltage.

A metal member embedded in the aluminum nitride based composite body is preferable to be a plate-type metal bulk material. In this case, when the metal embedded article is an electrostatic chuck, the metal member is a plate-type electrode made from the metal bulk material.

Since the metal member is fired together with the aluminum nitride powder, it is preferable to be made of a metal having a high melting point. As such a high melting point metal, mention may be made of tantalum, tungsten, molybdenum, platinum, rhenium, hafnium, and an alloy thereof. From a viewpoint of the prevention of semiconductors from contamination, tantalum, tungsten, molybdenum, platinum and alloys thereof are more preferable.

When the invention is applied to the electrostatic chuck, electrodes of the electrostatic chuck may be used as an electrode for generating plasma by connecting a high frequency power source to the electrodes and supplying a high frequency voltage together with a DC voltage thereto.

Further, the composite body according to the invention can be used as a substrate for the semiconductor manufacturing apparatus such as a susceptor for arranging a semiconductor wafer, a dummy wafer, a shadow ring, a tube for generating a high frequency plasma, a dome for generating a high frequency plasma, a high frequency transmitting window, an infrared transmitting window, a lift pin for supporting a semiconductor wafer, a shower plate and the like.

As an electronic functional material capable of applying the composite body according to the invention, there can be mentioned a heating source for induction heating (a heating material). That is, the composite body according to the invention has a high purity and is high in the corrosion resistance against plasma, so that it can be utilized as a heating source for induction heating used in a plasma atmosphere.

The invention will be concretely described with reference to experimental results.

There are prepared various composite bodies in Examples and Comparative Examples shown in Tables 1–4.

As a raw material powder is used aluminum nitride powder obtained by a reducing nitriding method. An additive solution is prepared by dissolving yttrium nitrate in isopropyl alcohol and mixed with the aluminum nitride powder in a pot mill. The mixing ratio of yttrium converted to $Y_2O_3$ and the amount of alumina added are also shown in Tables 1 and 3.

A disc-type shaped body having a diameter of 200 mm is produced by uniaxial pressing the raw material powder under a pressure of 200 kgf/cm². The disc-type shaped body is placed in a hot pressing mold and sealed hermetically. The temperature in the mold is raised at a temperature rising rate of 300° C./hour, during which the pressure is reduced over a temperature range of from room temperature to 1,000° C. After the temperature reaches 1,000° C., the pressure is raised up to 200 kgf/cm² stepwise while nitrogen gas is introduced at 2.5 kgf/cm². After the maximum temperature is varied as shown in Tables 1 and 3 and held for 4 hours at the maximum temperature, the shaped body is cooled at a cooling rate of 300° C./hour to 1,000° C. and cooled inside the furnace.

The crystal phase is identified with respect to each of the thus obtained composite bodies. Further, yttrium content (Y: wt %), total oxygen content (O: wt %), and difference between the total oxygen content and an oxygen content converted to $Y_2O_3$ (excessive oxygen content) in the composite body are shown in Tables 1 and 3. And also, the weight ratio when the difference between the total oxygen content and the oxygen content converted to $Y_2O_3$ is converted to $Al_2O_3$ is shown in Tables 1 and 3. Moreover, the oxygen content in aluminum nitride crystal grains as measured by means of the X-ray microanalyzer (oxygen content in grains) is shown in Tables 1 and 3.

Further, the following measurements are carried out with respect to each composite body to obtain results as shown in Tables 2 and 4.

(Main peak in cathode luminescence spectrum)

The cathode luminescence is measured as previously mentioned to obtain the position of the main peak.

(X-ray diffraction intensity ratio)

Peak intensities in γ-alumina type crystal and AlN are measured by an X-ray diffraction method to obtain a ratio thereof.

(Volume Resistivity at Room Temperature)

It is measured by a method of measuring a volume resistivity of an insulating substance according to JIS C 2141. In each Table, the volume resistivity is represented by using abbreviation. For example, "1.0E+14" means "$1.0 \times 10^{14}$".

In this case, it is measured at an applied field strength of 500 V/mm by providing a semi-circular sample having a diameter of 100 mm and a thickness of 0.8 mm and applying a silver paste thereto at an area of 3.14 cm².

(Apparent Activation Energy)

A change of the volume resistivity is measured over a range of from room temperature to 300° C. to calculate an apparent activation energy as a temperature dependence of volume resistivity.

(ESR Spin Amount (Spins/mg))

It is calculated from a resonance condition formula of ESR as previously mentioned.

(Average Grain Size)

It is determined by calculating an average value of major lengths of grains observed in an electron photomicrograph.

(Ratio of Diffraction Intensities $I_{002}/\Sigma I$)

A maximum value of a relative ratio of diffraction intensities ($I_{002}/\Sigma I$) on a pair of faces perpendicular to each other is measured by an X-ray diffraction method.

TABLE 1

|  | Addition amount as $Y_2O_3$ (wt %) | Amount of $Al_2O_3$ added (wt %) | Maximum temperature in firing (° C.) | Crystal phase other than AlN | Y (wt %) | Total oxygen content (wt %) | Difference between total oxygen content and oxygen content converted to $Y_2O_3$ | Amount converted to $Al_2O_3$ (wt %) | Oxygen content in grains (wt %) |
|---|---|---|---|---|---|---|---|---|---|
| Example 1 | 0.1 | 3 | 1800 | γ-alumina type | 0.076 | 2.02 | 2.00 | 4.25 | 0.53 |
| Example 2 | 0.1 | 4 | 1800 | γ-alumina type | 0.075 | 2.5 | 2.48 | 5.27 | 0.51 |
| Example 3 | 0.1 | 0.5 | 1800 | γ-alumina type | 0.082 | 0.93 | 0.91 | 1.93 | 0.50 |
| Example 4 | 0.1 | 2 | 1800 | γ-alumina type | 0.077 | 1.58 | 1.56 | 3.31 | 0.51 |
| Example 5 | 0.5 | 5 | 1800 | γ-alumina type | 0.078 | 2.91 | 2.89 | 6.14 | 0.54 |
| Example 6 | 0.1 | 5 | 2000 | γ-alumina type | 0.076 | 2.92 | 2.90 | 6.16 | 0.60 |
| Example 7 | 0.3 | 1 | 1800 | γ-alumina type | 0.23 | 1.21 | 1.15 | 2.44 | 0.45 |
| Example 8 | 0.3 | 3 | 1800 | γ-alumina type | 0.22 | 2.09 | 2.03 | 4.31 | 0.53 |
| Example 9 | 0.5 | 3 | 1800 | γ-alumina type | 0.36 | 2.12 | 2.02 | 4.30 | 0.52 |
| Example 10 | 0.5 | 1 | 1800 | γ-alumina type | 0.37 | 1.24 | 1.14 | 2.42 | 0.43 |
| Example 11 | 0.1 | 6 | 1800 | γ-alumina type | 0.075 | 3.7 | 3.68 | 7.82 | 0.52 |
| Example 12 | 0.1 | 7 | 1800 | γ-alumina type | 0.078 | 4.4 | 4.38 | 9.30 | 0.53 |
| Example 13 | 0.1 | 10 | 1800 | γ-alumina type | 0.077 | 5.9 | 5.88 | 12.49 | 0.52 |

TABLE 2

|  | Main peak in cathode luminescene spectrum (nm) | X-ray diffraction intensity ratio γ-alumina type crystal/AlN | Volume resistivity (Ω · cm, 25° C.) | Apparent activation energy (eV) | ESR spin amount (spin/mg) | Average grain size (μm) | Diffraction intensity ratio ($I_{002}/\Sigma I$) |
|---|---|---|---|---|---|---|---|
| Example 1 | 350–370 | 0.028 | 1.0E + 14 | 0.40 | 2.0E + 12 | 3.0 | 1.42 |
| Example 2 | 350–370 | 0.027 | 1.3E + 14 | 0.40 | 1.3E + 12 | 2.9 | 1.41 |
| Example 3 | 350–370 | 0.013 | 8.8E + 13 | 0.50 | 2.6E + 12 | 3.2 | 1.45 |
| Example 4 | 350–370 | 0.025 | 8.1E + 13 | 0.45 | 1.9E + 12 | 3.1 | 1.39 |
| Example 5 | 350–370 | 0.033 | 2.2E + 13 | 0.39 | 1.9E + 12 | 3.1 | 1.48 |
| Example 6 | 350–370 | 0.035 | 7.3E + 13 | 0.47 | 6.1E + 12 | 9.2 | 1.46 |
| Example 7 | 350–370 | 0.015 | 1.8E + 14 | 0.50 | 2.7E + 12 | 3.3 | 1.51 |
| Example 8 | 350–370 | 0.026 | 1.5E + 14 | 0.49 | 4.0E + 12 | 3.1 | 1.56 |
| Example 9 | 350–370 | 0.025 | 1.2E + 14 | 0.44 | 3.1E + 12 | 3.5 | 1.41 |
| Example 10 | 350–370 | 0.012 | 1.1E + 14 | 0.50 | 2.5E + 12 | 3.8 | 1.39 |
| Example 11 | 350–370 | 0.047 | 2.2E + 14 | 0.48 | 2.3E + 12 | 2.8 | 1.52 |
| Example 12 | 350–370 | 0.052 | 3.2E + 14 | 0.50 | 2.0E + 12 | 2.8 | 1.42 |
| Example 13 | 350–370 | 0.071 | 6.1E + 14 | 0.49 | 1.3B + 12 | 2.7 | 1.57 |

TABLE 3

|  | Addition amount as $Y_2O_3$ (wt %) | Amount of $Al_2O_3$ added (wt %) | Maximum temperature in firing (° C.) | Crystal phase other than AlN | Y (wt %) | Total oxygen content (wt %) | Difference between total oxygen content and oxygen content converted to $Y_2O_3$ | Amount converted to $Al_2O_3$ (wt %) | Oxygen content in grains (wt %) |
|---|---|---|---|---|---|---|---|---|---|
| Comparative Example 1 | 0 | 0 | 1800 | — | 0 | 0.71 | 0.71 | 1.51 | 0.49 |
| Comparative Example 2 | 0 | 0 | 1900 | — | 0 | 0.7 | 0.70 | 1.49 | 0.62 |
| Comparative Example 3 | 5 | 0 | 1900 | Y—Al—O | 3.5 | 2.1 | 1.16 | 2.46 | 0.35 |
| Comparative Example 4 | 3 | 0 | 1850 | Y—Al—O | 1.9 | 1.4 | 0.89 | 1.89 | 0.36 |
| Comparative Example 5 | 1 | 0 | 1900 | Y—Al—O | 0.72 | 0.98 | 0.79 | 1.67 | 0.36 |
| Comparative Example 6 | 0.1 | 4 | 1900 | γ-alumina type | 0.068 | 2.01 | 1.99 | 4.23 | 0.56 |
| Comparative Example 7 | 0.1 | 3 | 2000 | γ-alumina type | 0.069 | 2.46 | 2.44 | 5.19 | 0.65 |
| Comparative Example 8 | 0 | 4 | 2000 | γ-alumina type | 0 | 2.72 | 2.72 | 5.78 | 0.67 |
| Comparative Example 9 | 0.1 | 0.5 | 1900 | γ-alumina type | 0.067 | 0.91 | 0.89 | 1.89 | 0.61 |
| Comparative Example 10 | 0.1 | 3 | 1900 | γ-alumina type | 0.069 | 2.01 | 1.99 | 4.23 | 0.63 |
| Comparative Example 11 | 0.1 | 0 | 2000 | — | 0.065 | 0.66 | 0.64 | 1.36 | 0.65 |
| Comparative Example 12 | 0.3 | 5 | 1900 | γ-alumina type | 0.22 | 2.9 | 2.84 | 6.03 | 0.51 |
| Comparative Example 13 | 0.3 | 0 | 2000 | — | 0.065 | 0.52 | 0.50 | 1.07 | 0.66 |

TABLE 4

|  | Main peak in cathode luminescene spectrum (nm) | X-ray diffraction intensity ratio γ-alumina type crystal/AlN | Volume resistivity (Ω · cm, 25° C.) | Apparent activation energy (eV) | ESR spin amount (spin/mg) | Average grain size (μm) | Diffraction intensity ratio ($I_{002}/\Sigma I$) |
|---|---|---|---|---|---|---|---|
| Comparative Example 1 | 350–370 | 0.000 | 3.0E + 16 | 0.65 | 7.0E + 11 | 2.3 | 1.65 |
| Comparative Example 2 | 350–370 | 0.000 | 2.2E + 12 | 0.61 | 1.4E + 13 | 4.4 | 1.48 |
| Comparative Example 3 | 600 | 0.000 | 5.1E + 14 | 0.59 | 1.1E + 12 | 6.2 | 1.38 |
| Comparative Example 4 | 600 | 0.000 | 3.3E + 14 | 0.60 | 2.4E + 12 | 5.2 | 1.46 |

TABLE 4-continued

|  | Main peak in cathode luminescene spectrum (nm) | X-ray diffraction intensity ratio γ-alumina type crystal/AlN | Volume resistivity (Ω · cm, 25° C.) | Apparent activation energy (eV) | ESR spin amount (spin/mg) | Average grain size (μm) | Diffraction intensity ratio ($I_{002}/\Sigma I$) |
|---|---|---|---|---|---|---|---|
| Comparative Example 5 | 600 | 0.000 | 9.4E + 13 | 0.61 | 5.7E + 12 | 6.0 | 1.48 |
| Comparative Example 6 | 350–370 | 0.022 | 2.0E + 12 | 0.61 | 2.2E + 13 | 5.6 | 1.56 |
| Comparative Example 7 | 350–370 | 0.019 | 1.1E + 12 | 0.56 | 1.7E + 13 | 10.6 | 1.41 |
| Comparative Example 8 | 350–370 | 0.022 | 1.1E + 13 | 0.56 | 2.0E + 13 | 9.7 | 1.45 |
| Comparative Example 9 | 350–370 | 0.010 | 2.4E + 12 | 0.68 | 2.5E + 13 | 5.8 | 1.56 |
| Comparative Example 10 | 350–370 | 0.021 | 6.3E + 13 | 0.59 | 1.7E + 13 | 5.3 | 1.51 |
| Comparative Example 11 | 350–370 | 0.000 | 3.4E + 11 | 0.67 | 2.1E + 13 | 10.4 | 1.47 |
| Comparative Example 12 | 350–370 | 0.019 | 1.8E + 13 | 0.62 | 1.2E + 13 | 3.1 | 1.39 |
| Comparative Example 13 | 350–370 | 0.000 | 2.5E + 11 | 0.68 | 1.8E + 13 | 11.3 | 1.42 |

As seen from Tables 1 and 2, when the oxygen content in the aluminum nitride crystal grains is not less than 0.40% by weight but not more than 0.60% by weight and the spin amount is not less than $1\times10^{12}$ spins/mg but not more than $1\times10^{13}$ spins/mg, the activation energy is decreased to a level of not less than 0.50 eV. Further, it is effective that the addition amount as $Y_2O_3$ is within a range of 0.1–0.5% by weight and the amount of $Al_2O_3$ added is within a range of 0.5–10% by weight. And also, the main peak of the cathode luminescence is within a range of 350–370 nm.

As to the firing temperature, the apparent activation energy as the temperature dependence tends to lower at 1800° C.

Furthermore, the yttrium content (conversion value as oxide) is not less than 0.05% by weight but not more than 0.5% by weight. In addition, it is preferable that the difference between the total oxygen content in the composite body and the conversion oxygen content of yttrium converted to the oxide is within a range of 1.0–10% by weight. The average grain size of the aluminum nitride crystal grains is not more than 10 μm.

Moreover, the maximum value of the relative ratio of diffraction intensities on a pair of faces perpendicular to each other as measured by an X-ray diffraction method is not less than 1.3, concretely 1.39–1.57.

Figure 3:
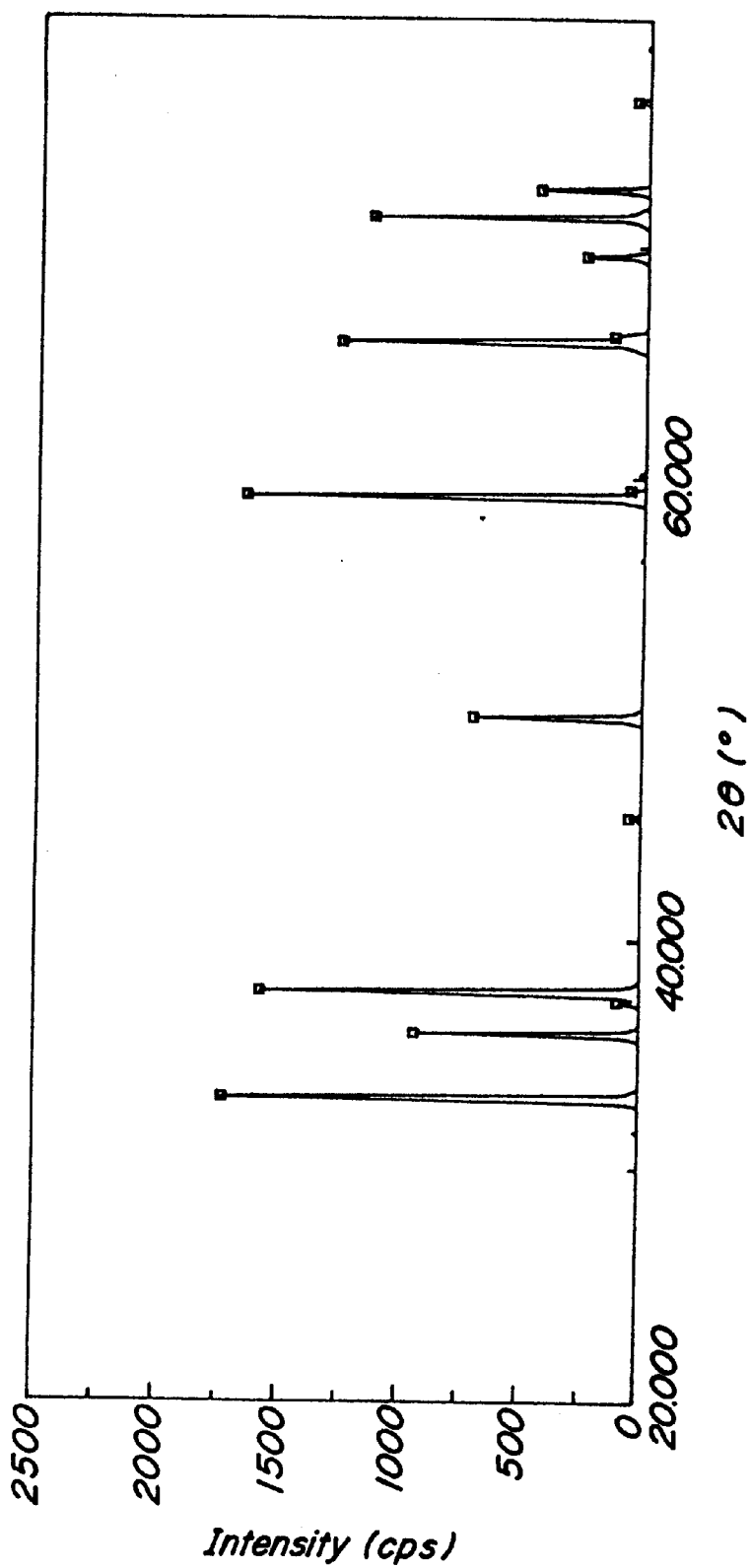
FIG. 3 is a graph showing X-ray diffraction peaks of the composite body in Example 1 according to the invention.

FIG. 2 shows a cathode luminescence spectrum in the composite body of Example 1 shown in Tables 1 and 2, and FIG. 3 is a graph showing X-ray diffraction peaks thereof.

On the other hand, as seen from Tables 3 and 4, in Comparative Examples 1 and 2, alumina and yttria are not added to the raw martial powder and there is substantially no crystal phase other than aluminum nitride. For this end, the oxygen content in the grains is not less than 0.40% by weight and the activation energy is not less than 0.6 eV. In Comparative Examples 3, 4 and 5, alumina is not added, but Y—Al—O crystal phase other than AlN is existent in the composite body, and the oxygen content in the grains is less than 0.40% by weight and the activation energy is not less than about 0.6 eV.

In Comparative Examples 6, 7, 8, 9 and 10, the amount of yttrium added is relatively small and the amount of alumina added is large, so that the oxygen content in the grains becomes large. However, the spin amount exceeds $10^{13}$ spins/mg and the activation energy is still large. In Comparative Example 11, alumina is not added and the amount of yttrium added is small, so that the crystal phase other than AlN is not observed, and the oxygen content in the grains is large and the spin amount exceeds $10^{13}$ spins/mg. In Comparative Examples 12 and 13, the increase of the activation energy is caused because the spin amount exceeds $10^{13}$ spins/mg. In Comparative Examples 11 and 13, the growth of the aluminum nitride crystal grains is remarkable and exceeds 10 μm in the average grain size.

In FIG. 4 is shown a relation between volume resistivity ρ and temperature T (or 1/T) with respect to the composite body of Example 1 shown in Tables 1 and 2 as a line A, and with respect to the aluminum nitride sintered body of Comparative Example 1 as a line B.

Figure 5:
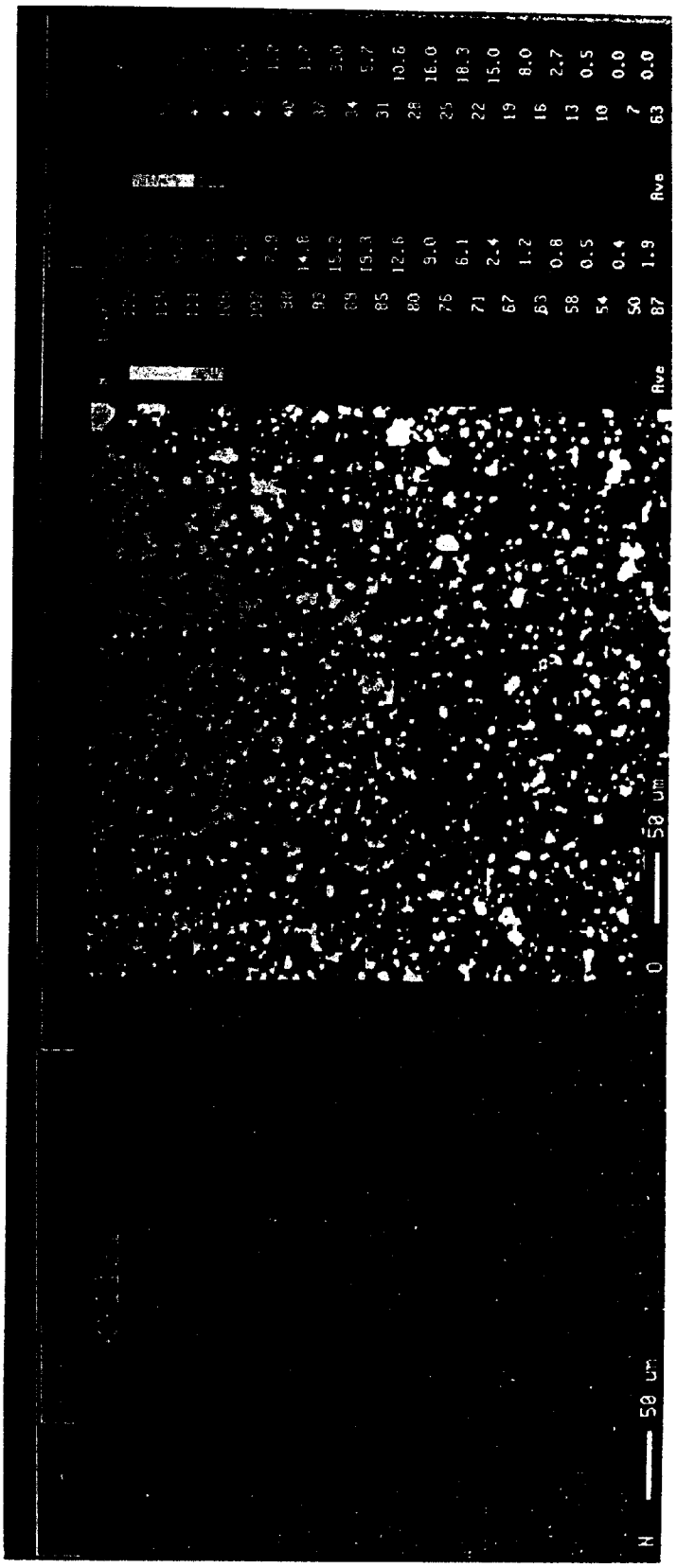
FIG. 5 is a photograph of a two-dimensional mapping showing an intensity distribution of a characteristic X-ray with respect to each of nitrogen and oxygen in the composite body according to the invention.
Figure 6:
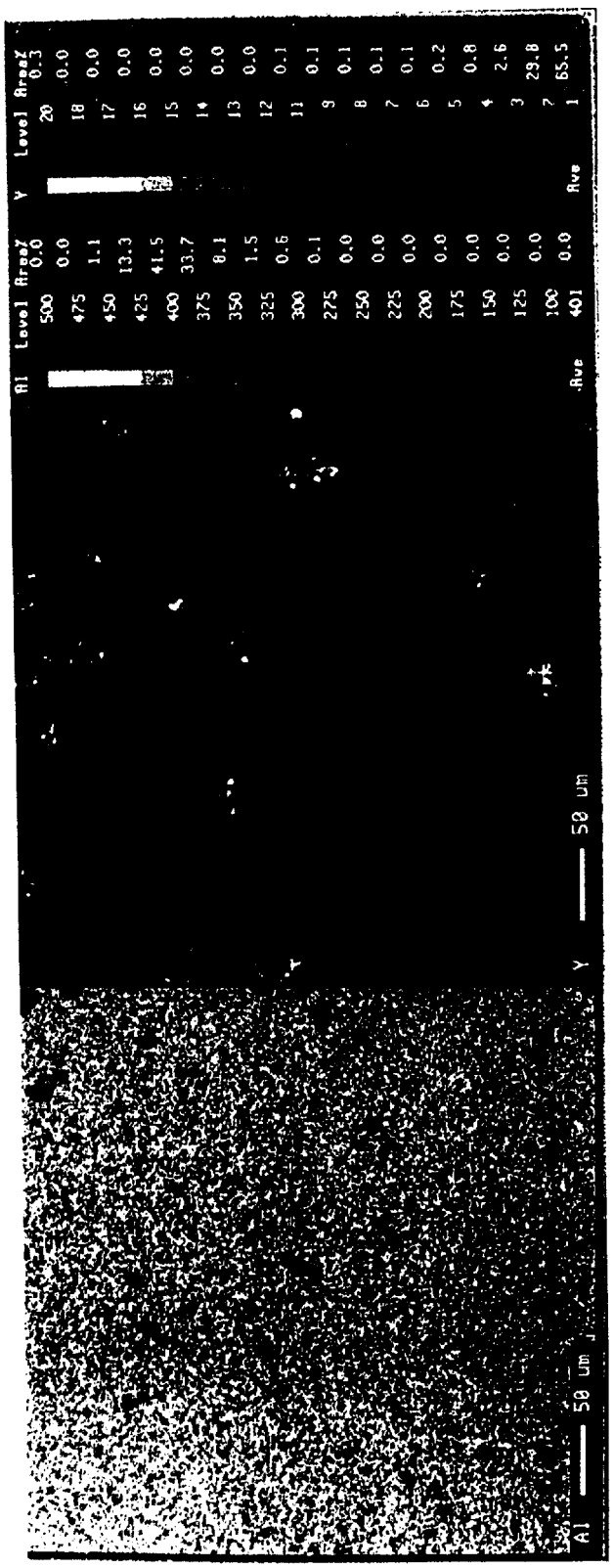
FIG. 6 is a photograph of a two-dimensional mapping showing an intensity distribution of a characteristic X-ray with respect to each of aluminum and yttrium in the composite body according to the invention.

Further, FIGS. 5 and 6 are two-dimensional mappings showing the intensity of a characteristic X-ray of each element of nitrogen, oxygen, aluminum and yttrium with respect to the composite body of Example 1 shown in Tables 1 and 2, respectively. The higher the brightness, the larger the intensity of the characteristic X-ray of the element or the larger the amount of the element.

It is found from these figures that the distribution amount of oxygen is still large in a region having a small distribution amount of nitrogen. This shows the formation of alumina $Al_2O_3$ in the region having a small distribution amount of nitrogen. Further, the distribution amount of aluminum in this region becomes somewhat decreased than that of a zone surrounding this region. In case of aluminum nitride (AlN), a ratio in the atom number of nitrogen to aluminum is 1:1, but in case of alumina ($Al_2O_3$), a ratio in the atom number of aluminum is smaller than that in AlN, so that it is considered that the intensity of the characteristic X-ray slightly lowers.

As mentioned above, according to the invention, it is succeeded to provide a novel material based on aluminum nitride having a small change of volume resistivity over a temperature range wider than that of the conventional aluminum nitride material.

What is claimed is:

1. An aluminum nitride based composite body comprising aluminum nitride crystal grains and γ-alumina type crystals, in which an oxygen content in the aluminum nitride crystal grains as measured by means of an X-ray microanalyzer is not less than 0.40% by weight but not more than 0.60% by weight, and a spin amount per unit mg of aluminum obtained from a spectrum as measured by an electron spin resonance method is not less than $1\times10^{12}$ spins/mg but not more than $1\times10^{13}$ spins/mg.

2. An aluminum nitride based composite body according to claim 1, wherein a ratio of an intensity of a diffraction peak (2θ=44–45°) of the γ-alumina type crystal to an intensity of a diffraction peak (100 face) of the aluminum nitride crystal is not less than 0.025 as measured by an X-ray diffraction method.

3. An aluminum nitride based composite body according to claim 1, wherein a main peak of a spectrum obtained by a cathode luminescence is within a range of 350–370 nm.

4. An aluminum nitride based composite body according to claim 1, wherein a volume resistivity of the aluminum nitride based composite body is not less than $1\times10^{13}$ Ω·cm at room temperature and an apparent activation energy as a temperature dependence of the volume resistivity is not more than 0.50 eV over a range of from room temperature to 300° C.

5. An aluminum nitride based composite body according to claim 1, wherein a content of a rare earth element (a conversion content as an oxide thereof) is within a range of 0.05–0.5% by weight.

6. An aluminum nitride based composite body according to claim 1, wherein a maximum value of a relative ratio of diffraction intensities at a pair of faces perpendicular to each other by an X-ray diffraction method is not less than 1.3.

7. An aluminum nitride based composite body according to claim 1, wherein an average grain size of the aluminum nitride crystal grains is not more than 10 µm.

8. An aluminum nitride based composite body according to claim 1, wherein an amount of a metal impurity other than the rare earth element included in the aluminum nitride based composite body is not more than 500 ppm.

9. An aluminum nitride based composite body according to claim 5, wherein a difference between a total oxygen content in the aluminum nitride based composite body and a conversion oxygen content of the rare earth element converted to an oxide thereof is within a range of 1.0–10% by weight.

10. An electronic functional material comprising an aluminum nitride based composite body as claimed in claim 1.

11. An aluminum nitride based composite body comprising aluminum nitride crystal grains and γ-alumina type crystals, in which a main peak of a spectrum obtained by a cathode luminescence is within a range of 350–370 nm, and a spin amount per unit mg of aluminum obtained from a spectrum as measured by an electron spin resonance method is not less than $1\times10^{12}$ spins/mg but not more than $1\times10^{13}$ spins/mg.

12. An electronic functional material comprising an aluminum nitride based composite body as claimed in claim 11.

* * * * *